US007369012B2

(12) United States Patent
Hongo et al.

(10) Patent No.: US 7,369,012 B2
(45) Date of Patent: May 6, 2008

(54) ANTENNA DUPLEXER

(75) Inventors: Masanori Hongo, Osaka (JP); Natsuyo Nagano, Osaka (JP); Takashi Ogura, Kyoto (JP); Hideki Ito, Osaka (JP); Toshio Tanuma, Osaka (JP)

(73) Assignee: Sanyo Electric Co., Ltd., Moriguchi-shi (JP)

( * ) Notice: Subject to any disclaimer, the term of this patent is extended or adjusted under 35 U.S.C. 154(b) by 0 days.

(21) Appl. No.: 10/992,642

(22) Filed: Nov. 22, 2004

(65) Prior Publication Data

US 2005/0116789 A1 Jun. 2, 2005

(30) Foreign Application Priority Data

Nov. 27, 2003 (JP) ............................ 2003-397970

(51) Int. Cl.
*H01P 5/12* (2006.01)
*H03H 9/00* (2006.01)

(52) U.S. Cl. ....................... 333/126; 333/133; 333/193

(58) Field of Classification Search ................ 333/126, 333/133, 193–196

See application file for complete search history.

(56) References Cited

U.S. PATENT DOCUMENTS 6,339,365 B1 * 1/2002 Kawase et al. ............. 333/193
6,466,103 B2 * 10/2002 Iwamoto et al. ............ 333/133
6,489,860 B1 * 12/2002 Ohashi ........................ 333/133
6,566,981 B2 * 5/2003 Urabe et al. ................ 333/193
6,759,924 B2 * 7/2004 Sakuragawa et al. ....... 333/133
6,838,956 B2 * 1/2005 Bradley ....................... 333/189
6,943,645 B2 * 9/2005 Taniguchi ................... 333/133
6,965,282 B2 * 11/2005 Kawachi et al. ............ 333/193
7,030,716 B2 * 4/2006 Tsutsumi et al. ........... 333/193

FOREIGN PATENT DOCUMENTS

JP 11-340781 12/1999
JP 2000-307383 11/2000
JP 2001352227 * 12/2001

* cited by examiner

*Primary Examiner*—Benny Lee
*Assistant Examiner*—Kimberly E Glenn
(74) *Attorney, Agent, or Firm*—Kratz, Quintos & Hanson, LLP

(57) ABSTRACT

The present invention provides an antenna duplexer comprising a transmitting filter and a receiving filter which are mounted on a package, a transmitting signal input pad and a transmitting signal output pad which are connected to input and output ends of the transmitting filter, a receiving signal input pad and a receiving signal output pad which are connected to input and output ends of the receiving filter, and at least one grounding pad. The pads are arranged, on a surface of the package, along at least two sides of four sides of a quadrangle. The transmitting signal input pad and the receiving signal output pad are disposed at diagonal positions of the quadrangle and are furthest away from one another.

4 Claims, 3 Drawing Sheets

ANTENNA DUPLEXER

BACKGROUND OF THE INVENTION

1. Field of the Invention

The present invention relates to antenna duplexers mounted on portable telephones, etc.

2. Description of Related Art

As shown in FIG. 3, an antenna duplexer 80 comprises an antenna terminal ANT to be connected to an antenna, a transmitting signal terminal Tx to be connected to a transmitting circuit, and a receiving signal terminal Rx to be connected to a receiving circuit. The antenna terminal ANT is connected to the transmitting signal terminal Tx and the receiving signal terminal Rx via a branchpoint 10. A transmitting filter 51 comprising a surface acoustic wave device is interposed on a signal line connected to the transmitting signal terminal Tx through the branchpoint 10 while a receiving filter 41 comprising a surface acoustic wave device is interposed on a signal line connected to the receiving signal terminal Rx through the branchpoint 10 (see JP-A-340781/1999).

Furthermore interposed between the branchpoint 10 and the receiving filter 41 is a phase-matching strip line 7 for phase rotation, to match the phases between the transmitting filter 51 and the receiving filter 41 (see JP-A-307383/2000). Incidentally the phase-matching strip line 7 is interposed between the branchpoint 10 and the filter having a higher pass band of the transmitting filter 51 and the receiving filter 41.

FIG. 4 shows the construction of the antenna duplexer 80 which is enclosed in a package. The transmitting filter 51 and the receiving filter 41 are mounted on a surface of a multilayer ceramic package 82. Arranged into two rows in the surrounding area of the filters 51, 41 are a transmitting signal input pad 9*a* and a transmitting signal output pad 9*b* to be connected to input-output terminals of the transmitting filter 51, a receiving signal input pad 9*c* and a receiving signal output pad 9*d* to be connected to input-output terminals of the receiving filter 41, and a plurality of grounding pads 91 (see JP-A-340781/1999).

With the antenna duplexer, when a signal is to be transmitted, the signal received by the transmitting signal terminal Tx passes through the transmitting filter 51 and thereafter is fed from the antenna terminal ANT to an antenna. In this case there occurs a phenomenon that the signal received by the transmitting signal terminal Tx sneaks around to the receiving signal terminal Rx, so that there is a need to take sufficient isolation measures against the phenomenon.

Accordingly with the conventional antenna duplexer, various isolation measures are heretofore taken to a signal path from the transmitting signal terminal Tx to the receiving signal terminal Rx via the transmitting filter 51 and the receiving filter 41. However, the conventional antenna duplexer has not yet achieved the sufficient isolation effect, and therefore there is still room for more improvement.

SUMMARY OF THE INVENTION

An object of the present invention is to provide an antenna duplexer having a simple construction and achieving a higher isolation effect than conventionally.

We have conducted intensive research and found the cause of failing to achieve a sufficient isolation effect with the conventional antenna duplexer. Based on the result we have succeeded in developing an antenna duplexer for achieving a further higher isolation effect than conventionally.

With the conventional antenna duplexer, as shown in FIG. 4, a transmitting signal input pad 9*a* and a receiving signal output pad 9*d* are arranged inwardly from grounding pads 91*e*, 91*f* on end portions, respectively. The two pads 9*a*, 9*d* are, therefore, positioned in proximity to one another. Accordingly, as indicated by an arrow in FIG. 4, some of signals input from a transmitting signal terminal Tx to the transmitting signal input pad 9*a* directly sneaks around to the receiving signal output pad 9*d* and is fed from the receiving signal output pad 9*d* to a receiving signal terminal Rx.

The antenna duplexer embodying the present invention comprises a transmitting filter 51 and a receiving filter 41 which are mounted on a package 83, a transmitting signal input pad 9*a* and a transmitting signal output pad 9*b* which are connected to input and output ends of the transmitting filter 51, a receiving signal input pad 9*c* and a receiving signal output pad 9*d* which are connected to input and output ends of the receiving filter 41, and at least one grounding pad 91. The pads 9*a*, 9*b*, 9*c*, 9*d*, 91 are arranged, on a surface of the package 83, along at least two sides of four sides of a quadrangle. The transmitting signal input pad 9*a* and the receiving signal output pad 9*d* are disposed at diagonal positions of the quadrangle and are furthest away from one another.

Stated more specifically, an antenna terminal ANT, a transmitting signal terminal Tx, and a receiving signal terminal Rx are arranged on side surfaces of the package 83. The transmitting signal input pad 9*a* is connected to the transmitting signal terminal Tx, the transmitting signal output pad 9*b* and the receiving signal input pad 9*c* are connected to the antenna terminal ANT, the receiving signal output pad 9*d* is connected to the receiving signal terminal Rx.

With the antenna duplexer of the present invention, the distance between the transmitting signal input pad 9*a* and the receiving signal output pad 9*d* is made greater than the conventional antenna duplexer, thus inhibiting the signal received by the transmitting signal input pad 9*a* from sneaking around to the receiving signal output pad 9*d*, to improve the isolation characteristics.

It is not conventionally recognized that a slight difference of distance between the transmitting signal input pad 9*a* and the receiving signal output pad 9*d* exerts a great influence on the signal sneaking between the two pads. According to the present invention, enlarging the distance to maximum improves the isolation characteristics.

As described above, the antenna duplexer of the present invention can achieve a higher isolation effect than conventionally with the simple structure wherein the positions of the transmitting signal input pad 9*a* and the receiving signal output pad 9*d* are merely altered.

DETAILED DESCRIPTION OF THE INVENTION

Figure 2:
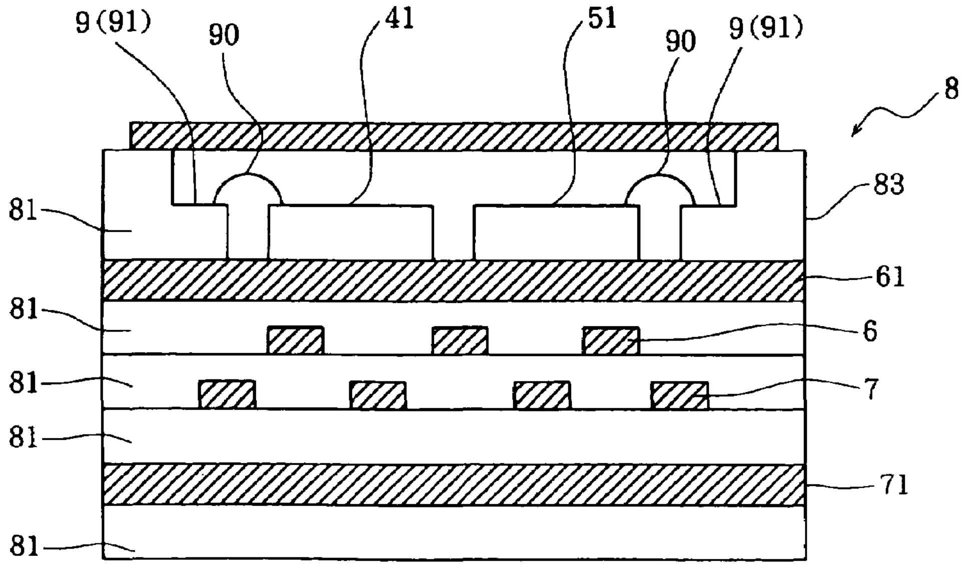
FIG. 2 is a view in section of the antenna duplexer.
Figure 3:
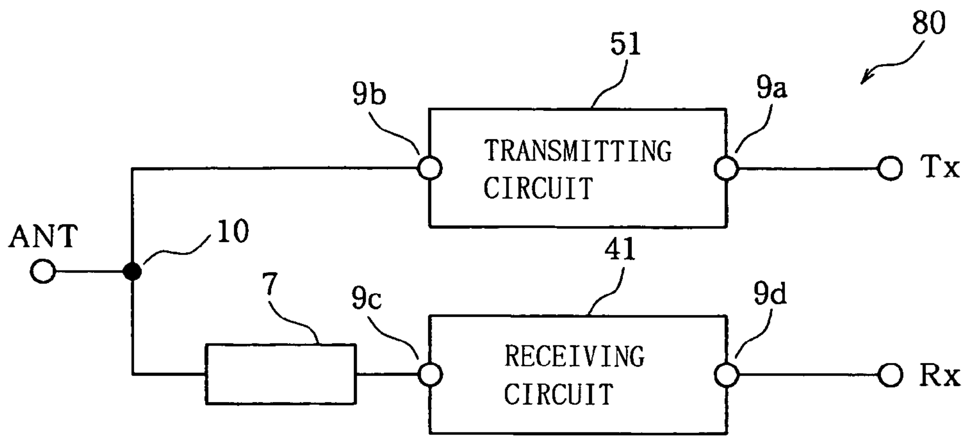
FIG. 3 is a block diagram showing the circuit construction of the antenna duplexer.

An embodiment of the present invention will be described below with reference to the drawings. An antenna duplexer embodying the present invention, as shown in FIG. 2, includes a rectangular parallelepipedal package 83 having a plurality of ceramic layers 81 superposed. Formed on a surface of the uppermost ceramic layer 81 is a recess portion defined by four vertical walls. A transmitting filter 51 and a receiving filter 41 are mounted on a bottom surface of the recess portion. Further, formed on surfaces of the four lower ceramic layers 81 constituting the package 83 are, in order from a bottom layer, a grounding layer 71, phase-matching strip line 7, circuit element pattern 6 which requires a capacitor etc., and grounding layer 61.

Figure 1:
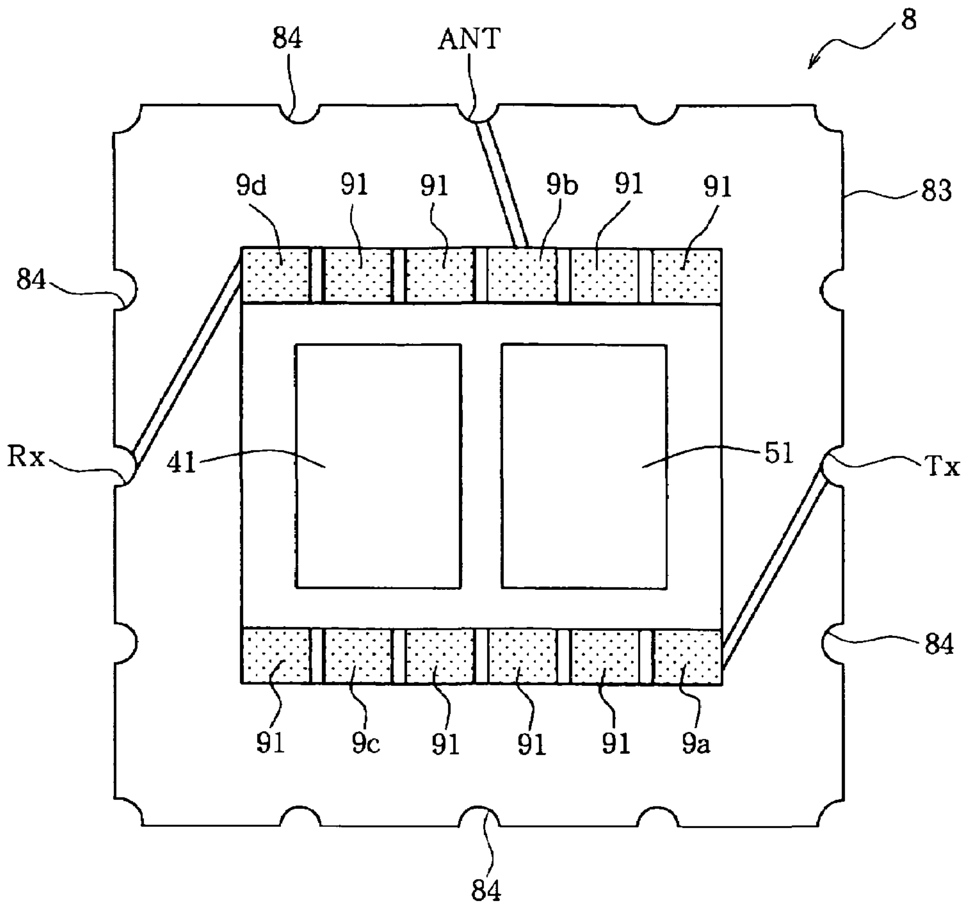
FIG. 1 is a plan view of an antenna duplexer embodying the present invention.

As shown in FIG. 1, the package 83 has a surface provided thereon with, at opposite sides of the transmitting filter 51 and the receiving filter 41, a transmitting signal input pad 9*a*, transmitting signal output pad 9*b*, receiving signal input pad 9*c*, receiving signal output pad 9*d*, and a plurality of grounding pads 91. The pads are arranged into two rows along two vertical walls of the recess portion and parallel to each other. The transmitting signal input pad 9*a* and the receiving signal output pad 9*d* are installed at diagonal positions of a quadrangle defined by the four vertical walls of the recess portion, i.e., installed at an end of one row and an end of the other row. As shown in FIG. 2, the aforementioned pads 9, 91 are connected to the transmitting filter 51 and the receiving filter 41 by bonding wires 90.

Formed on four side surfaces of the package 83 are a plurality of castellations 84 including an antenna terminal ANT, transmitting signal terminal Tx and receiving signal terminal Rx. The transmitting signal input pad 9*a* is connected to the transmitting signal terminal Tx, the receiving signal output pad 9*d* is connected to the receiving signal terminal Rx, and the transmitting signal output pad 9*b* is connected to the antenna terminal ANT.

Figure 4:
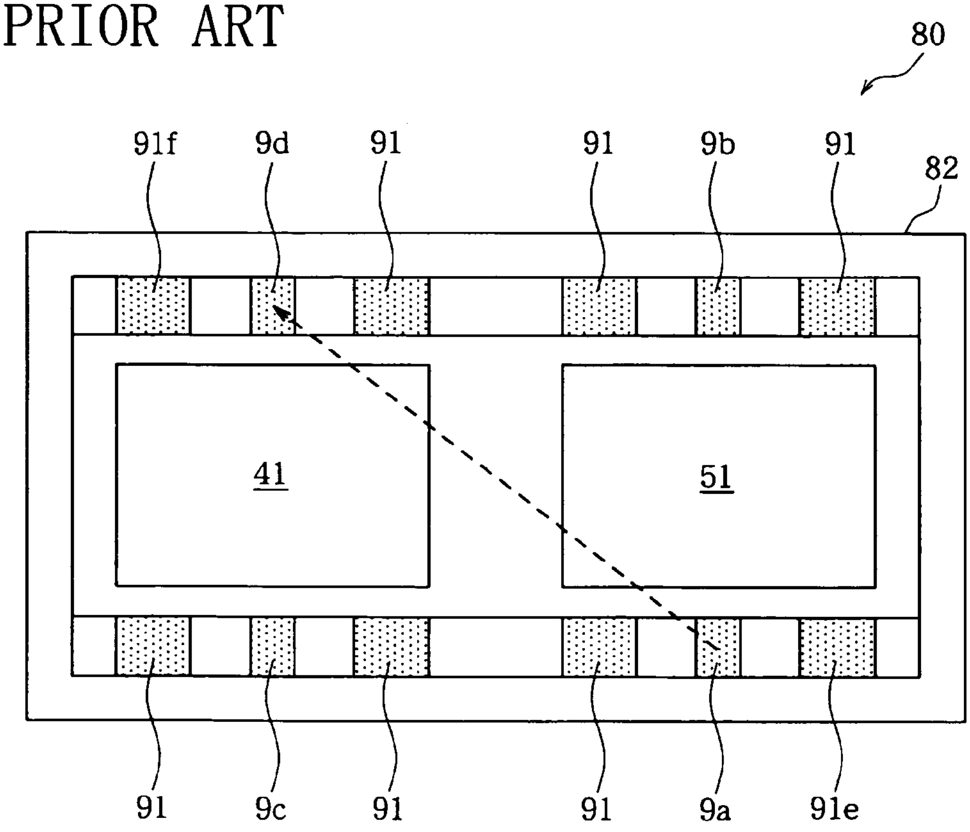
FIG. 4 PRIOR ART
FIG. 4 is s plan view of the conventional antenna duplexer.

With the antenna duplexer 8 shown in FIG. 1 of the present invention, the distance between the transmitting signal input pad 9*a* and the receiving signal output pad 9*d* is made greater than the distance between the two pads 9*a* and 9*d* with the conventional antenna duplexer shown in FIG. 4. Consequently the signal received by the transmitting signal input pad 9*a* is effectively inhibited from directly sneaking around to the receiving signal output pad 9*d*, to thereby achieve a higher isolation effect.

Figure 5:
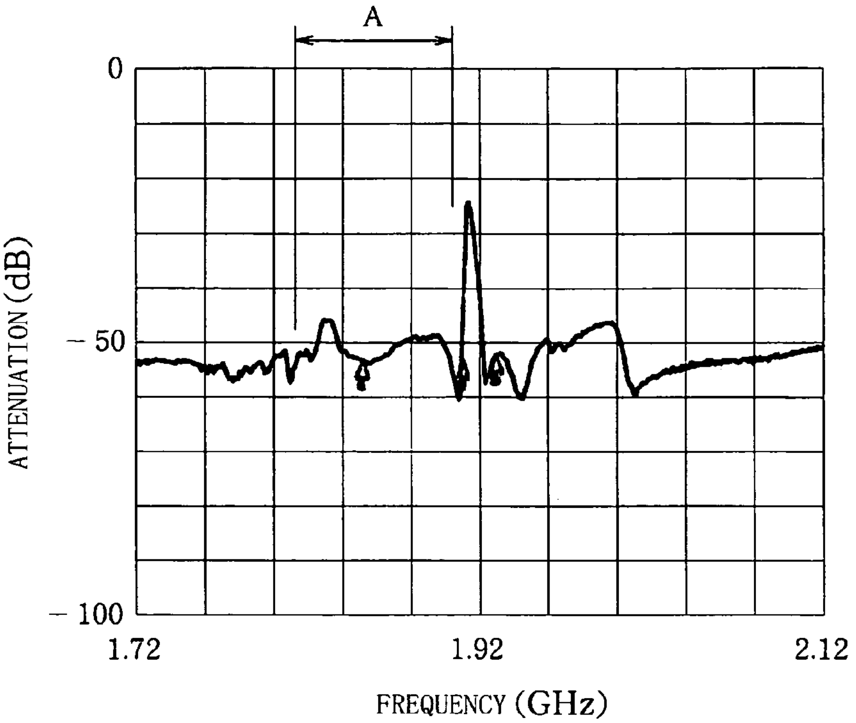
FIG. 5 is a graph showing the isolation characteristics of the antenna duplexer of the present invention.
Figure 6:
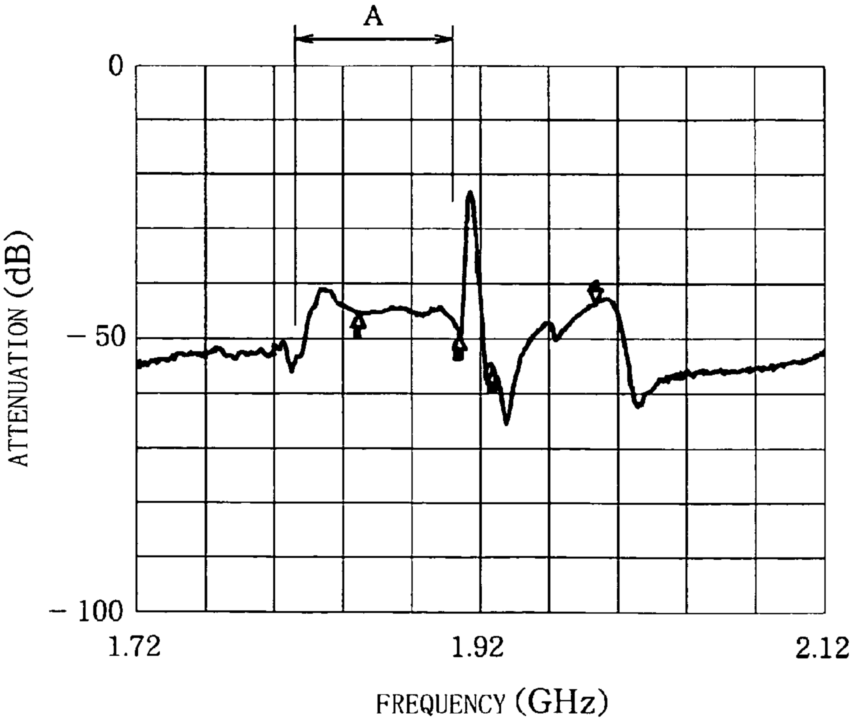
FIG. 6 PRIOR ART
FIG. 6 is a graph showing the isolation characteristics of the conventional antenna duplexer.

FIG. 5 shows the isolation characteristics of the signal received by the transmitting signal terminal Tx to sneak around to the receiving signal terminal Rx, with the antenna duplexer 8 shown in FIG. 1 of the present invention. FIG. 6 shows the similar isolation characteristics with the conventional antenna duplexer 80 shown in FIG. 4. Particularly, within the pass band A in the figures, the isolation characteristics of the antenna duplexer of the present invention shown in FIG. 5 is approximately 5 dB greater in attenuation than the isolation characteristics of the conventional antenna duplexer shown in FIG. 6. This clarifies the improvement of the isolation characteristics.

As discussed above, the transmitting signal input pad 9*a* and the receiving signal output pad 9*d* are merely moved, respectively, to an end of the row in which each of the pads are arranged, whereby the antenna duplexer of the present invention can achieve the higher isolation effect.

The device of the invention is not limited to the foregoing embodiment in construction but can be modified variously by one skilled in the art without departing from the spirit of the invention as set forth in the appended claims. For example, a plurality of pads 9*a*, 9*b*, 9*c*, 9*d*, 91 can be arranged along four sides of the quadrangle. In this case the isolation characteristics can also be improved by arranging the transmitting signal input pad 9*a* and the receiving signal output pad 9*d* at diagonal positions of a quadrangle.

What is claimed is:

1. An antenna duplexer comprising a transmitting filter and a receiving filter, in a parallel circuit with each other, which are mounted on a package, a transmitting signal input pad and a transmitting signal output pad which are connected to input and output ends of the transmitting filter, a receiving signal input pad and a receiving signal output pad which are connected to input and output ends of the receiving filter, and at least one grounding pad, the transmitting signal input pad, the transmitting signal output pad, the receiving signal input pad, the receiving signal output pad and at least one grounding pad being arranged, on a surface of the package, along at least two sides of four sides of a quadrangle, the transmitting signal input pad and the receiving signal output pad being disposed at diagonal positions of the quadrangle.

2. An antenna duplexer according to claim 1 wherein an antenna terminal, a transmitting signal terminal, and a receiving signal terminal are arranged on side surfaces of the package, the transmitting signal input pad being connected to the transmitting signal terminal, the transmitting signal output pad and the receiving signal input pad being connected to the antenna terminal, and the receiving signal output pad being connected to the receiving signal terminal.

3. An antenna duplexer according to claim 1 wherein the transmitting signal input pad and the receiving signal output pad are furthest away from one another of any two of the pads arranged along the at least two sides of the four sides of the quadrangle.

4. An antenna duplexer comprising a transmitting filter and a receiving filter, in a parallel circuit with each other, which are mounted on a package, a transmitting signal input pad and a transmitting signal output pad which are connected to input and output ends of the transmitting filter, a receiving signal input pad and a receiving signal output pad which are connected to input and output ends of the receiving filter, and at least one grounding pad, the transmitting signal input pad, the transmitting signal output pad, the receiving signal input pad, the receiving signal output pad and at least one grounding pad being arranged along two parallel lines on a surface of the package, either one of the transmitting signal input pad and the receiving signal output pad being disposed at an endmost position of one of the two parallel lines, with the other pad being disposed at an endmost position of the other line in the opposite direction.

* * * * *